US008841160B2

(12) United States Patent
Min et al.

(10) Patent No.: US 8,841,160 B2
(45) Date of Patent: Sep. 23, 2014

(54) METHODS FOR PRODUCING CHALCOPYRITE COMPOUND THIN FILMS FOR SOLAR CELLS USING MULTI-STAGE PASTE COATING

(71) Applicant: Korea Institute of Science and Technology, Seoul (KR)

(72) Inventors: Byoung Koun Min, Seoul (KR); Hee Sang An, Seoul (KR); Yun Jeong Hwang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/687,122

(22) Filed: Nov. 28, 2012

(65) Prior Publication Data

US 2014/0070347 A1    Mar. 13, 2014

(30) Foreign Application Priority Data

Sep. 13, 2012    (KR) .................. 10-2012-0101710

(51) Int. Cl.
*H01L 21/00*    (2006.01)
*H01L 31/18*    (2006.01)
*H01L 31/032*    (2006.01)

(52) U.S. Cl.
CPC ............ *H01L 31/0322* (2013.01); *H01L 31/18* (2013.01)
USPC ....................... 438/95; 257/431; 257/E31.027

(58) Field of Classification Search
USPC .............. 438/95; 257/431, E31.027; 136/262
See application file for complete search history.

(56) References Cited

U.S. PATENT DOCUMENTS

| 2006/0062902 A1 | 3/2006 | Sager et al. | |
|---|---|---|---|
| 2011/0030799 A1* | 2/2011 | Fujdala et al. | 136/262 |
| 2012/0080091 A1* | 4/2012 | Min et al. | 136/262 |
| 2012/0138866 A1* | 6/2012 | Agrawal et al. | 252/501.1 |
| 2012/0313200 A1* | 12/2012 | Jackrel et al. | 257/431 |

FOREIGN PATENT DOCUMENTS

KR    1020090092471 A    9/2009

OTHER PUBLICATIONS

Vijay K. Kapur, et al; "Non-vacuum processing of $CuIn_{1-y}Ga_ySe_2$ solar cells on rigid and flexible substrates using nanoparticles precursor inks", Thin Solid Films, vols. 431-432, pp. 53-57, May 1, 2003.
David B. Mitzi, et al; "A High-Efficiency Solution-Deposited Thin-Film Photovoltaic Device", Advanced Materials, vol. 20, Issue 19, pp. 3657-3662, Oct. 2, 2008.

* cited by examiner

*Primary Examiner* — Phuc Dang
(74) *Attorney, Agent, or Firm* — Ladas & Parry LLP

(57) ABSTRACT

Disclosed are methods for producing chalcopyrite compound (e.g., copper indium selenide (CIS), copper indium gallium selenide (CIGS), copper indium sulfide (CIS) or copper indium gallium sulfide (CIGS)) thin films. The methods are based on solution processes, such as printing, particularly, multi-stage coating of pastes or inks of precursors having different physical properties. Chalcopyrite compound thin films produced by the methods can be used as light-absorbing layers for thin-film solar cells. The use of the chalcopyrite compound thin films enables the fabrication of thin-film solar cells with improved efficiency at low costs.

20 Claims, 6 Drawing Sheets

(a)

(b)

METHODS FOR PRODUCING CHALCOPYRITE COMPOUND THIN FILMS FOR SOLAR CELLS USING MULTI-STAGE PASTE COATING

CROSS-REFERENCE TO RELATED APPLICATIONS

This application claims priority under 35 U.S.C. §119 to Korean Patent Application No. 10-2012-0101710 filed on Sep. 13, 2012, in the Korean Intellectual Property Office, the disclosure of which is incorporated herein by reference in its entirety.

BACKGROUND OF THE INVENTION

1. Field of the Invention

The present invention relates to methods for producing chalcopyrite compound (e.g., copper indium selenide (CIS), copper indium gallium selenide (CIGS), copper indium sulfide (CIS) or copper indium gallium sulfide (CIGS)) thin films that can be used as light-absorbing layers for thin-film solar cells. More specifically, the present invention relates to methods for producing chalcopyrite compound thin films as light-absorbing layers for thin-film solar cells based on solution processes, such as printing, particularly, multi-stage coating of pastes or inks of precursors having different physical properties. The use of chalcopyrite compound thin films produced by the methods enables the fabrication of thin-film solar cells with improved efficiency at low costs.

2. Description of the Related Art

Solar cells can produce electricity directly from sunlight, which is a clean and safe energy source. For this reason, solar cells have attracted considerable attention as the most promising future candidates for energy production. Various kinds of inorganic and organic semiconductors are applied to the fabrication of solar cells. Representative examples of solar cells that have been commercially successful to date include silicon solar cells using silicon (Si) as a main material, and CIGS thin-film solar cells. Silicon solar cells have the advantage of high photoelectric conversion efficiency but suffer from high fabrication costs. Under such circumstances, thin-film solar cells using compound semiconductors that can be formed into thinner films are of growing interest as potential replacements for silicon solar cells.

As representative examples, mention may be made of thin-film solar cells using, as light-absorbing layers, chalcopyrite thin films including Group IB, IIIA and VIA elements known as CIS or CIGS. In such a kind of solar cell, a light-absorbing thin-film layer having the composition of $Cu(In,Ga)(S,Se)_2$ and a buffer thin-film layer composed of CdS or another n-type compound semiconductor are considered the most crucial elements. Particularly, the CIS or CIGS light-absorbing layer is the most important factor determining the performance of the solar cell.

The CIS or CIGS light-absorbing layer is typically produced by co-evaporation or sputtering of metal elements. Specifically, the CIS or CIGS thin film may be deposited by co-evaporation of several components, usually three components, through several stages. Alternatively, the CIS or CIGS thin film may be produced by sputtering Cu, In and Ga metal targets to deposit Cu, In and Ga, followed by selenization. However, all such processes are carried out under vacuum conditions that require expensive vacuum systems. The use of the vacuum systems is responsible for the loss of vast amounts of the costly raw materials, such as indium or gallium, and makes the production of the thin film on a large are at high processing speed difficult.

On the other hand, methods for producing CIGS thin films by inexpensive chemical processes instead of using vacuum systems are known as substitutes for vacuum deposition processes. Particularly, methods for producing CIGS thin films by printing are known as the most promising in terms of processing speed, processing cost and large-area production. Methods for producing CIGS thin films by printing can be broadly divided into two groups of methods. The first group uses an ink or paste composed of precursors. The second group uses an ink or paste prepared by dispersion CIG or CIGS nanoparticles.

As an example of the first group of methods using precursors, Mitzi et al. reported a method for the production of a CIGS thin film which includes dissolving binary compounds, such as $Cu_2S$, $In_2Se_3$ and $Ga_2Se$, in hydrazine as a solvent to prepare an ink of the precursors, depositing the ink on a conductive substrate, and thermally treating the deposited substrate in a nitrogen atmosphere [Mitzi et al. Advanced Materials, 2008, 20, 3657-3662]. As another example, Korean Unexamined Patent Publication No. 10-2009-0092471 discloses a method for producing a CIGS thin film which includes dissolving Cu, In and Ga nitrates and $SeCl_4$ in an alcohol as a solvent, mixing the solution with an organic binder, etc. to prepare a paste, depositing the paste on a conductive substrate, and thermally treating the deposited substrate in a $H_2$/Ar atmosphere.

As an example of the second group of methods using nanoparticles, U.S. Patent Publication No. 2006/0062902 discloses a method for producing a CIGS thin film which includes synthesizing and dispersing CIGS nanoparticles, depositing the dispersion on a conductive substrate, and thermally treating the deposited substrate. Another method is known in which CuInGa oxide nanoparticles are synthesized, dispersed and deposited on a conductive substrate, and thermally treated in a $H_2Se$ atmosphere to produce a CIGS thin film [Kapur et al. Thin Solid Films 2003, 431-432, 53-57].

Several problems of the conventional methods for the production of CIGS thin films based on printing are causes of low efficiency. The most important one of the problems is associated with the degree of compaction of thin films. Generally, thin films produced by vacuum deposition processes have very densely packed structures substantially free of pores, whereas thin films produced by solution processes have many pores formed during evaporation of solvents or organic additives by thermal treatment. Constituent materials of buffer layers (e.g., CdS), window layers (e.g., ZnO) or metal electrodes (e.g. Al) penetrate thin films through pores in the fabrication of solar cell devices to form shunt paths, which cause low voltage generation and eventually result in deterioration of solar cell efficiency. In view of this, there is a need to develop methods for producing thin films that are based on solution processing while minimizing the formation of pores, thus being suitable for the fabrication of high-efficiency thin-film solar cells.

There is also a need to develop methods for producing CIGS thin films based on solution processing by which the concentration distributions of the constituent elements in the thin films can be easily controlled. For example, a method for producing a thin film based on solution processing designed such that the concentrations of Ga in the front and back portions of the thin film are higher than the concentration of Ga in the intermediate portion of the thin film, needs to be developed. This concentration difference increases the local band-gap of a predetermined area in the thin film to prevent the frequent occurrence of electron-hole recombination at the interfaces, contributing to an increase in overall efficiency as well as Voc. Therefore, the method would be very important in the realization of high-efficiency chalcopyrite compound thin-film solar cells at low costs.

SUMMARY OF THE INVENTION

It is a first object of the present invention to provide methods for producing high-quality chalcopyrite compound thin films with dense surfaces by low-cost multi-stage paste or ink coating.

It is a second object of the present invention to provide chalcopyrite compound thin films for solar cells which are produced based on paste coating by which the distributions of the constituent elements can be controlled.

It is a third object of the present invention to provide high-efficiency solar cells using chalcopyrite compound thin films having dense surfaces.

According to an aspect of the present invention, there is provided a method for producing a chalcopyrite compound thin film, including (a) mixing a first metal precursor, a first organic binder, and a first water-soluble solvent to obtain a first paste, (b) mixing a second metal precursor, a second organic binder, and a second water-soluble solvent to obtain a second paste, (c) coating the first paste on a conductive substrate to form a first paste layer, (d) coating the second paste on the first paste layer to form a second paste layer, (e) thermally treating the coated conductive substrate in air or an oxygen atmosphere to obtain a mixed oxide thin film, and (f) thermally treating the mixed oxide thin film in a sulfur gas, a selenium gas or a sulfur/selenium mixed gas atmosphere to form a sulfide or selenide thin film.

According to another aspect of the present invention, there is provided a method for producing a chalcopyrite compound thin film, including (a) mixing first metal precursors, a first organic binder, and a first water-soluble solvent to obtain a first paste, (b) mixing second metal precursors, a second organic binder and a second water-soluble solvent to obtain a second paste, (c) coating the first paste on a conductive substrate to form a first paste layer, (d) coating the second paste on the first paste layer to form a second paste layer, (e) thermally treating the coated conductive substrate in air or an oxygen atmosphere to obtain a CIG mixed oxide thin film, and (f) thermally treating the CIG mixed oxide thin film in a sulfur gas, a selenium gas or a sulfur/selenium mixed gas atmosphere to form a CIGS thin film.

According to yet another aspect of the present invention, there is provided a chalcopyrite compound thin film produced by solution processing wherein the concentrations of Ga in the upper and lower portions are higher than the concentration of Ga in the central portion.

As described above, according to the methods of the present invention, CIGS or CIS thin films can be produced using pastes or inks of Cu, In and Ga precursors without the need to use vacuum systems. In addition, the consumption of metal raw materials can be minimized. Therefore, the methods of the present invention enable the production of the thin films in an economical manner. Furthermore, the degrees of compaction of the thin films can be controlled, the coating rates can be improved, and the distributions of the elements can be controlled. Due to these advantages, the methods of the present invention can realize the fabrication of high-efficiency thin-film solar cells at low costs.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
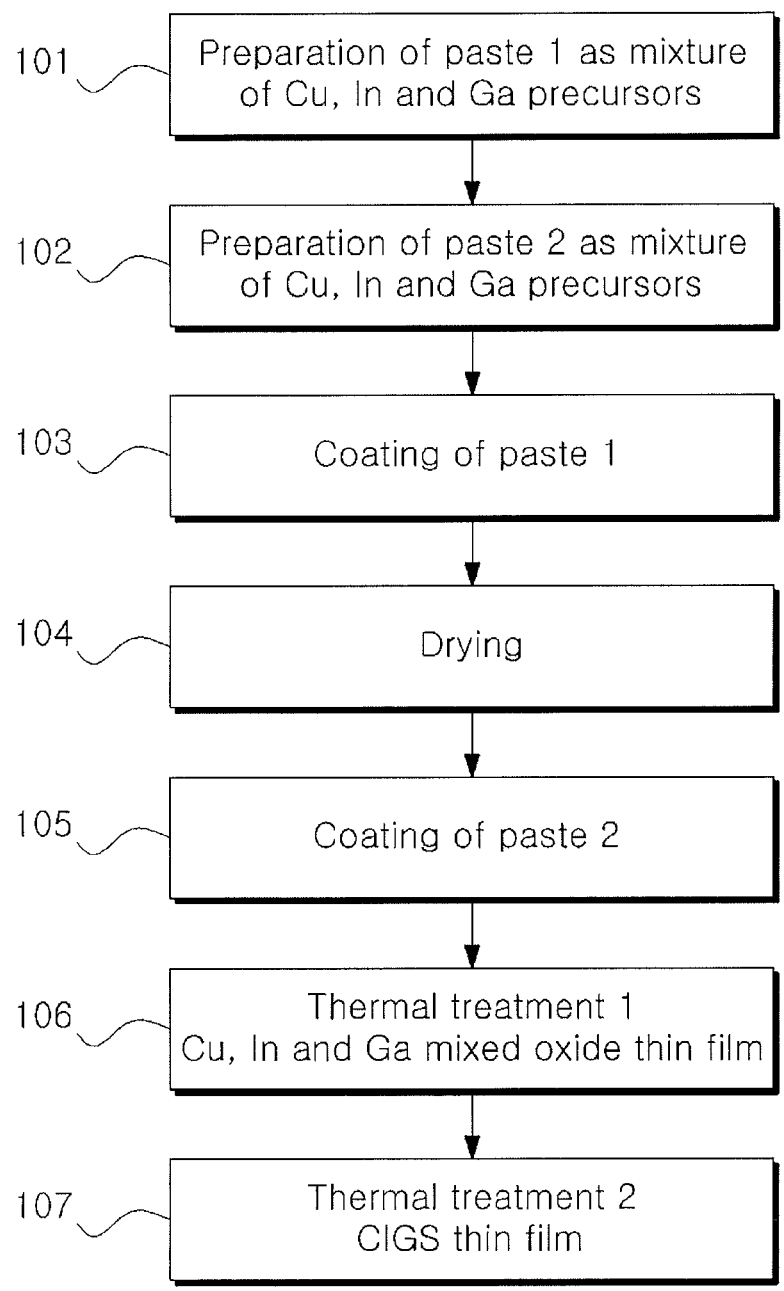
FIG. 1 is a block diagram showing a method for producing a CIGS thin film by multi-stage coating of two kinds of pastes with different physical properties.

The present invention is directed to methods for producing chalcopyrite compound thin films based on solution processing. Specifically, the present invention is directed to methods for producing chalcopyrite compound thin films by coating paste or ink (hereinafter, also referred to without distinction as 'paste') solutions twice or more to form a plurality of coating layers as light-absorbing layers in which the adjacent light-absorbing layers have different microstructures and different Ga concentration distributions.

In an aspect, the present invention provides a method for producing a chalcopyrite compound thin film, including (a) mixing a first metal precursor, a first organic binder, and a first water-soluble solvent to obtain a first paste, (b) mixing a second metal precursor, a second organic binder and a second water-soluble solvent to obtain a second paste, (c) coating the first paste on a conductive substrate to form a first paste layer, (d) coating the second paste on the first paste layer to form a second paste layer, and repeatedly coating the pastes, (e) thermally treating the coated conductive substrate in air or an oxygen atmosphere to obtain a mixed oxide thin film, and (f) thermally treating the mixed oxide thin film in a sulfur gas, a selenium gas or a sulfur/selenium mixed gas atmosphere to form a sulfide or selenide thin film.

The first metal precursor and the second metal precursor, which may be identical to or different from each other, are each independently a precursor of one or more Group IB metals, a precursor of one or more Group IIIA metals, or a mixture thereof. The precursor of one or more Group IB metals and the precursor of one or more Group IIIA metals are each independently included in either the first metal precursor or the second metal precursor or both of them.

In another aspect, the present invention provides a method for producing a chalcopyrite compound thin film, including (a) mixing first metal precursors, a first organic binder, and a first water-soluble solvent to obtain a first paste, (b) mixing second metal precursors, a second organic binder and a second water-soluble solvent to obtain a second paste, (c) coating the first paste on a conductive substrate to form a first paste layer, (d) coating the second paste on the first paste layer to form a second paste layer, and repeatedly coating the pastes, (e) thermally treating the coated conductive substrate in air or an oxygen atmosphere to obtain a CIG mixed oxide thin film, and (f) thermally treating the CIG mixed oxide thin film in a sulfur gas, a selenium gas or a sulfur/selenium mixed gas atmosphere to form a CIGS thin film.

The first metal precursors and the second metal precursors, which may be identical to or different from each other, are each independently two or more kinds of precursors selected from Cu, In and Ga precursors. The Cu, In and Ga precursors are each independently included in either the first metal precursors or the second metal precursors or both of them.

In several aspects and embodiments, the first water-soluble solvent and the second water-soluble solvent, which may be identical to or different from each other, are each independently selected from water, alcohol, acetone, and mixtures thereof.

As used herein, the term of 'water-soluble solvent' means any solvent that is substantially miscible with water, and may (or may not) be (or comprise) water.

The first organic binder and the second organic binder, which may be identical to or different from each other, are each independently selected from ethyl cellulose, polyvinyl acetate, palmitic acid, polyethylene glycol, polypropylene glycol, polypropylene carbonate, propylenediol, and mixtures thereof.

The conductive substrate may be made of indium tin oxide, fluorine-doped indium tin oxide, glass, Mo-coated glass, a metal foil, a metal plate, a conductive polymer material, or a mixture thereof. A non-conductive substrate coated with indium tin oxide, fluorine-doped indium tin oxide, glass, Mo-coated glass, a metal foil, a metal plate, a conductive polymer material or a mixture thereof may be used as the conductive substrate.

In a preferred embodiment of the present invention, the viscosity of the first paste is different by 400 to 1,500 cP from that of the second paste. Due to this viscosity difference, the microstructures of the adjacent light-absorbing layers are different enough to improve the performance of a final solar cell.

In a further preferred embodiment, the first and second pastes have viscosities not lower than 700 cP and not higher than 300 cP, respectively, particularly 700 to 1,500 cP and 50 to 300 cp, respectively. Within the viscosity ranges defined above, internal compaction and surface flatness of the light-absorbing layers can be ensured simultaneously.

In another embodiment of the present invention, the first organic binder is preferably (i) ethyl cellulose or (ii) a mixture including 90 to 99.9 parts by weight of ethyl cellulose and 0.1 to 10 parts by weight of polyvinyl acetate, palmitic acid, polyethylene glycol, polypropylene glycol, polypropylene carbonate, propylenediol or a mixture thereof; and the second organic binder is preferably (i) polyvinyl acetate or (ii) a mixture including 90 to 99.9 parts by weight of polyvinyl acetate and 0.1 to 10 parts by weight of ethyl cellulose, palmitic acid, polyethylene glycol, polypropylene glycol, polypropylene carbonate, propylenediol or a mixture thereof. Even when each of the organic binders is coated only once, internal compaction and surface flatness of the light-absorbing layers can be ensured.

In another embodiment of the present invention, the ratios of the concentration of the Cu element to the sum of the concentrations of the In and Ga elements in the first and second paste layers are preferably 1:0.9-1.3, most preferably 1:1.2.

The ratio of the concentration of the Ga element to that of the Cu element in the first paste layer is preferably different by 0.1 to 0.9 from the ratio of the concentration of the Ga element to that of the Cu element in the second paste layer. Due to this concentration difference, the concentration distributions of the Ga element in the adjacent light-absorbing layers are different enough to improve the performance of a final solar cell.

In another embodiment of the present invention, the method may further include forming a third paste layer on the second paste layer wherein the ratios of the concentration of the Cu element to the sum of the concentrations of the In and Ga elements in the first, second and third paste layers are preferably 1:0.9-1.3:0.9-1.3. The concentration distributions of the Ga element in the paste layers are preferably adjusted such that the ratios of the concentration of the Ga element to that of the Cu element in the first and third paste layers are greater by 0.1 to 0.9 than the ratio of the concentration of the Ga element to that of the Cu element in the second paste layer. Particularly, when the Ga concentrations in the upper and lower portions are higher than the Ga concentration in the central portion within the range defined above, no recombination of electrons and holes occurs at the interfaces.

In an embodiment of the present invention, steps (e) and (f) may be carried out at temperatures of 250 to 550° C. and 400 to 600° C., respectively, the sulfur gas atmosphere may be a $H_2S$ gas or S vapor atmosphere, and the selenium gas atmosphere may be a $H_2Se$ gas or Se vapor atmosphere.

In a further embodiment of the present invention, step (c) may further include (c-1) drying the first paste coated on the conductive substrate. The first paste is preferably dried in an air atmosphere at 100 to 300° C. The drying markedly improves the processing speed and enables the production of the thin film on a large area.

In another embodiment of the present invention, step (d) may further include (d-1) drying the second paste coated on the first paste layer. The second paste is preferably dried in an air atmosphere at 100 to 300° C. The drying further markedly improves the processing speed and enables the production of the thin film on a large area.

In an embodiment of the present invention, the Cu precursor may be (i) a hydroxide, nitrate, sulfate, acetate, chloride, acetylacetonate, formate or oxide of Cu, (ii) a hydroxide, nitrate, sulfate, acetate, chloride, acetylacetonate, formate or oxide of a Cu/In or Cu/Ga alloy, or (iii) a mixture thereof.

The In precursor may be (i) a hydroxide, nitrate, sulfate, acetate, chloride, acetylacetonate, formate or oxide of In, (ii) a hydroxide, nitrate, sulfate, acetate, chloride, acetylacetonate, formate or oxide of an In/Cu or In/Ga alloy, or (iii) a mixture thereof.

The Ga precursor may be (i) a hydroxide, nitrate, sulfate, acetate, chloride, acetylacetonate, formate or oxide of Ga, (ii) a hydroxide, nitrate, sulfate, acetate, chloride, acetylacetonate, formate or oxide of a Ga/Cu or Ga/In alloy, or (iii) a mixture thereof.

In a further aspect of the present invention, (i) the first paste may further include a dispersant selected from α-terpineol, ethylene glycol, thioacetamide, ethylenediamine, and mixtures thereof; (ii) the second paste may further include a dispersant selected from α-terpineol, ethylene glycol, thioacetamide, ethylenediamine, and mixtures thereof; or (iii) each of the first and second pastes may further include a dispersant selected from α-terpineol, ethylene glycol, thioacetamide, ethylenediamine, and mixtures thereof.

In another embodiment of the present invention, the first and second pastes may each independently further include a dopant selected from Na, K, Ni, P, As, Sb, Bi, and mixtures thereof. The dopant may be present in an amount of 1 to 100 parts by weight, based on 100 parts by weight of the first metal precursors and/or the second metal precursors.

In another aspect, the present invention provides a chalcopyrite compound thin film produced by solution processing wherein the concentrations of Ga in the upper and lower portions are higher than the concentration of Ga in the central portion.

In another aspect, the present invention provides a chalcopyrite compound thin film including, as light-absorbing layers, at least two coating layers formed on a conductive substrate wherein the light-absorbing layer positioned relatively close to the conductive substrate has a higher average density than the light-absorbing layer relatively remote from the conductive substrate.

In another aspect, the present invention provides a chalcopyrite compound thin film including, as light-absorbing layers, at least two coating layers formed on a conductive substrate wherein the light-absorbing layer positioned relatively close to the conductive substrate includes, as an organic binder, (i) ethyl cellulose or (ii) a mixture including 90 to 99.9 parts by weight of ethyl cellulose and 0.1 to 10 parts by weight of polyvinyl acetate, palmitic acid, polyethylene glycol, polypropylene glycol, polypropylene carbonate, propylenediol or a mixture thereof; and the light-absorbing layer positioned relatively remote from the conductive substrate includes, as an organic binder, (i) polyvinyl acetate or (ii) a mixture including 90 to 99.9 parts by weight of polyvinyl acetate and 0.1 to 10 parts by weight of ethyl cellulose, palmitic acid, polyethylene glycol, polypropylene glycol, polypropylene carbonate, propylenediol or a mixture thereof.

In yet another aspect, the present invention provides a chalcopyrite compound thin film including, as light-absorbing layers, at least three coating layers formed on a conductive substrate wherein the ratios of the concentration of the Ga element to that of the Cu element in the light-absorbing layer positioned closest to the conductive substrate and the light-absorbing layer remotest from the conductive substrate are greater by 0.1 to 0.9 than the ratio of the concentration of the Ga element to that of the Cu element in the light-absorbing layer positioned between the two other light-absorbing layers.

Hereinafter, explanation will be given about the aspects and embodiments of the present invention.

The first object of the present invention is solved by the provision of a method for producing a chalcopyrite compound thin film which includes: (1) mixing Cu, In and Ga precursors in a water-soluble solvent, and adding an organic binder to the precursor mixture to obtain a paste or ink; (2) preparing two or more kinds of pastes or inks of Cu, In and Ga precursors having different physical properties according to intended applications and purposes; (3) coating one of the pastes or inks on a conductive substrate by printing, spin coating or spraying, drying the coated paste or ink to form a thin film, coating another paste or ink on the thin film, removing residual organic matter from the coating structure by thermal treatment in air or an oxygen gas atmosphere to obtain a CIG mixed oxide thin film; and thermally treating the CIG oxide thin film in a sulfurizing or selenizing gas atmosphere to obtain a sulfurized and/or selenized CIGS thin film.

The abbreviation CIS or CIGS in the present description refers to a copper indium selenide or copper indium gallium selenide thin film having the composition represented by $Cu(In,Ga)(S,Se)_2$.

The constitutions of the method according to the present invention regarding the preparation of CIG precursor pastes or inks and the production of CIGS thin films using the pastes or inks, which are features of the present invention, will be described with reference to FIG. 1.

As shown in FIG. 1, in step (1), Cu, In, and Ga precursors are prepared, dissolved in a water-soluble solvent with stirring, and mixed with an organic binder and an organic additive to prepare a CIG precursor paste or ink (101 in FIG. 1).

Examples of Cu, In and Ga precursors suitable for use in the present invention include hydroxides, nitrates, sulfates, acetates, chlorides, acetylacetonates, formates and oxides of the corresponding metals and alloys thereof.

Examples of water-soluble solvents suitable for dissolution of the Cu, In and Ga precursors include water, alcohol and acetone.

One or more additive components selected from dispersants and binders may be added to the precursor mixture during mixing and stirring. The additive components may be suitably selected according to the purpose of use of the paste or ink.

The dispersants and binders may be selected from those commonly used in the art. Examples of the dispersants include α-terpineol, ethylene glycol, thioacetamide, and ethylenediamine. Examples of the binders include ethyl cellulose, polyvinyl acetate, palmitic acid, polyethylene glycol, polypropylene glycol, polypropylene carbonate, and propylenediol. The amounts of the dispersants or the binders used are determined depending on the viscosity of the paste or ink.

The mixture of the metal precursors as raw materials may further include a dopant component. The dopant component functions to improve the efficiency of a solar cell to be fabricated using the final thin film in a subsequent process. As the dopant component, there may be used, a metal, for example, Na, K, Ni, P, As, Sb or Bi, or a combination thereof. The dopant component may be any compound capable of creating ions of the corresponding metal in the reaction system. The dopant component is suitably used in an amount of about 1 to about 100% by weight, based on the total weight of the precursor mixture.

Next, in step (2), a paste or ink of Cu, In and Ga precursors is prepared in the same manner as in step (1). However, the paste or ink prepared in step (2) has a viscosity different from that of the paste or ink prepared in step (1) by varying the kind and amount of the binder according to the purpose of use. The paste or ink prepared in step (2) has a composition of the elements different from that of the paste or ink prepared in step (1) according to the purpose of use (102 in FIG. 1). For example, the paste or ink of step (1) has a viscosity of at least 1000 cP and the paste or ink of step (2) has a viscosity not greater than 100 cP. For example, when the concentration ratio Cu:In:Ga in the paste or ink of step (1) is 1:0.7:0.3, the concentration ratio Cu:In:Ga in the paste or ink of step (2) is 1:1:0.

Next, in step (3), the two or more kinds of pastes or inks are sequentially coated on a substrate and thermally treated in air or an oxygen atmosphere to form a CIS oxide thin film (103-106 in FIG. 1). The substrate is made of a conductive material, for example, any material that can withstand a calcination temperature of at least 300° C. Examples of such substrate materials include indium tin oxide (ITO), fluorine-doped indium tin oxide (FTO) glass, Mo-coated glass, metal foils, metal plates, and conductive polymer materials. A structure including a non-conductive substrate and a conductive thin-film layer formed on the non-conductive substrate may also be used.

The coating of the pastes or inks (103 and 105 in FIG. 1) may be performed by suitable techniques known in the art, for example, doctor blade coating, screen printing, spin coating, and spraying. The thickness of each of the thin films formed by one-time coating may vary depending on the viscosity of the corresponding paste or ink but is typically in the range of 100 to 2000 nm.

Drying may be performed after coating of the first paste or ink and before coating of the second paste or ink (104 in FIG. 1). The drying is performed in air at a temperature ranging from 100 to 300° C. The purpose of the drying is to remove the organic solvent used in the preparation of the paste or ink. As a result of the drying, the thin film is solidified.

The coating structure obtained after the multi-stage paste or ink coating is thermally treated to a temperature ranging from 200 to 700° C., preferably from 250 to 550° C., in air or an oxygen gas atmosphere (106 in FIG. 1). The thermal treatment is performed to remove residual carbon originating from the organic solvents, the organic additives and the organic binders used in the preparation of the pastes or inks. As a result of the thermal treatment, a CIG oxide thin film having a residual carbon of 1 at % or less may be obtained.

Next, in step (3), the CIG oxide thin film is sulfurized or selenized in a sulfur or selenium atmosphere (107 in FIG. 1). The sulfurization may be performed by thermal treatment in a gas atmosphere, such as a $H_2S$ or S vapor atmosphere, or an atmosphere of a mixed gas thereof with an inert gas. The thermal treatment temperature may be determined depending on the kind of the conductive substrate but is preferably in the range of 400 to 600° C. The selenization may be performed by thermally treating the oxidized or sulfurized CIGS thin film in a selenium atmosphere. The thermal treatment temperature may be determined depending on the kind of the conductive substrate but is preferably in the range of 400 to 600° C. As the selenium source, $H_2Se$ gas may be used but Se vapor is more preferred because of the toxicity of $H_2Se$ gas.

As described above, the methods of the present invention are based on paste or ink printing rather than co-evaporation or sputtering, which is typically used in the art. The use of the paste or ink printing can reduce loss of raw materials in the fabrication of CIGS or CIS solar cells and allows for mass fabrication of large-area solar cells at high processing speeds. In addition, according to the methods of the present invention, CIGS thin films are produced by completely removing organic matter from the coated pastes or inks composed of the precursors of the elements, unlike conventional printing methods. Therefore, the growth of CIGS crystal grains possibly caused by residual carbon impurities can be suppressed and the problem of low solar cell efficiency resulting from the growth of crystal grains can be solved. In addition, the use of the two or more kinds of pastes or inks having different physical properties enables utilization of the advantages of the pastes or inks in the production of thin films. The compositions of the constituent elements and the concentration distributions of the elements at different thicknesses of the thin films are easy to control. Therefore, techniques, such as Ga grading, for improving the efficiency of thin-film solar cells can be effectively applied.

The methods of the present invention are suitable for the production of light-absorbing thin-film layers including Group IB, IIIA and VIA elements for solar cells as well as CIS or CIGS thin films.

EXAMPLES

The constitutions and features of the present invention will be explained with reference to the following examples. However, the examples are provided for illustrative purposes only and are not intended to limit the scope of the invention.

Example 1

Production of CIGS Thin Film Using Multi-Stage Coating of Two Kinds of Pastes Having Different Viscosities 1 g (5 mmol) of $Cu(NO_3)_2.xH_2O$, 0.4 g (1.6 mmol) of $Ga(NO_3)_3.xH_2O$ and 1.12 g (3.7 mmol) of $In(NO_3)_3.xH_2O$ were dissolved in 80 mL of ethanol. The solution was mixed with 20 mL of a solution of 13.7 g of terpineol and 0.75 g of ethyl cellulose in ethanol with stirring. Thereafter, the ethanol was removed by evaporation at 40° C. for 1 hr to obtain a CIG precursor paste having a sufficiently high viscosity. The paste was spin coated on a Mo glass substrate and dried on a hot plate at 150° C. for 3 min. As a result of the drying, the paste was solidified.

1 g (5 mmol) of $Cu(NO_3)_2.xH_2O$, 0.4 g (1.6 mmol) of $Ga(NO_3)_3.H_2O$, and 1.12 g (3.7 mmol) of $In(NO_3)_3.xH_2O$ were dissolved in 7 mL of methanol. The solution was mixed with 1 g of polyvinyl acetate and 7 mL of methanol with stirring to prepare a CIG precursor paste having a different viscosity from the previous CIG precursor paste. The paste was spin coated on the thin film of the previous CIG precursor paste, followed by sequential drying on a hot plate at 150° C. for 3 min and 300° C. for 7 min.

After drying, the substrate, on which the thin films were formed, was thermally treated in a furnace in an air atmosphere at 350° C. for 1 hr and in a sulfur vapor atmosphere at 500° C. for 30 min to obtain a CIGS thin film.

Figure 2:
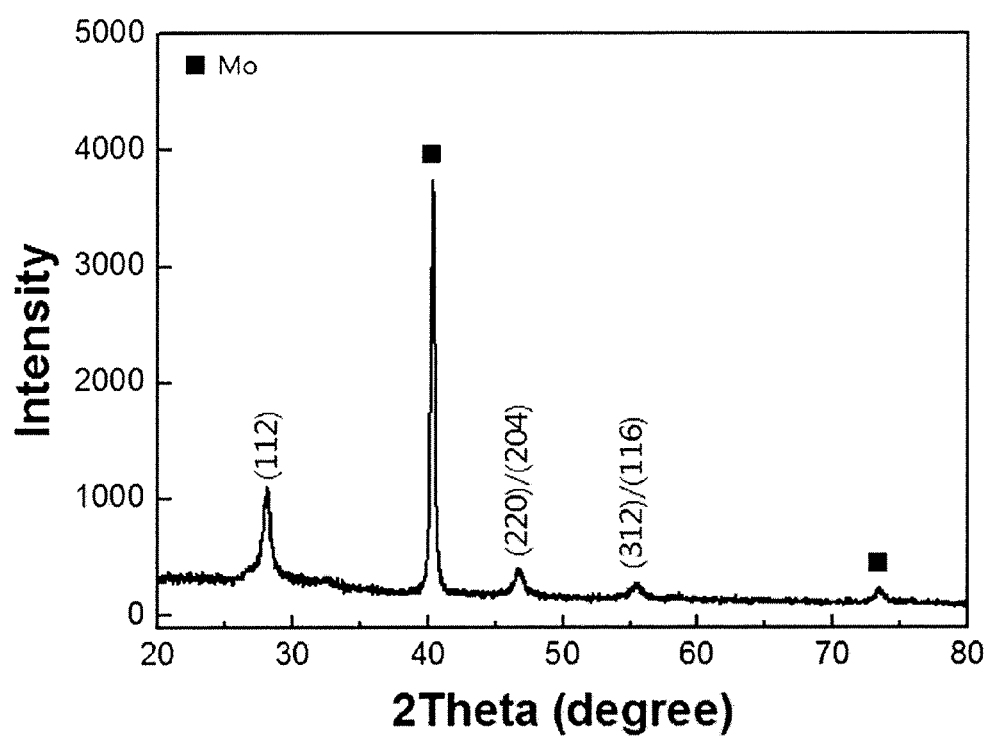
FIG. 2 is an XRD pattern of a CIGS thin film produced by multi-stage coating of two kinds of pastes with different physical properties.
Figure 3:
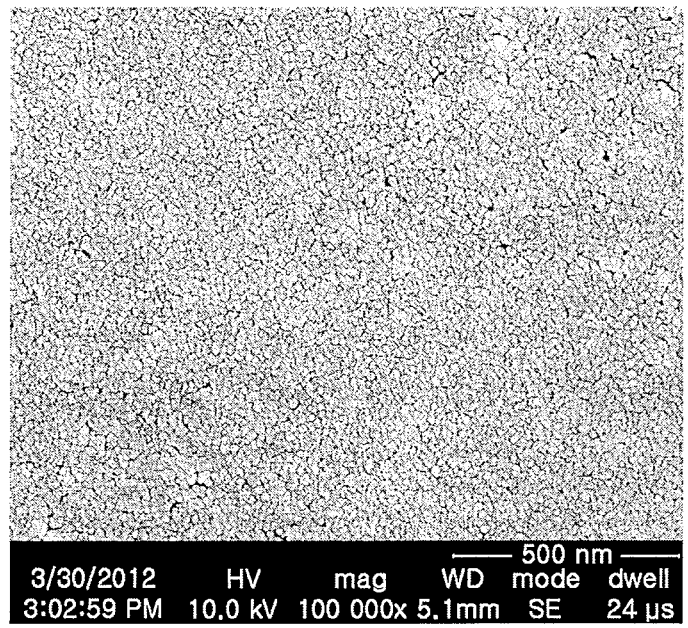
FIG. 3 shows front (3a) and side (3b) SEM images of a CIGS thin film produced by multi-stage coating of two kinds of pastes with different physical properties.
Figure 3:
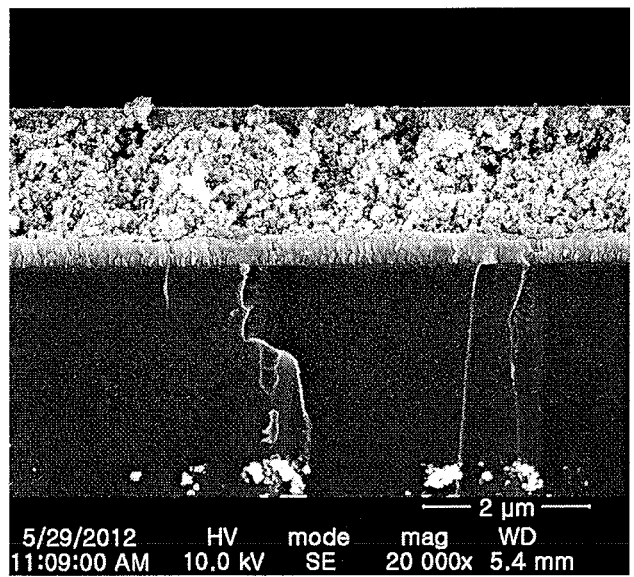

An XRD pattern and SEM images of the CIGS thin film are shown in FIGS. 2 and 3, respectively. Analysis of the XRD pattern confirmed that the CIGS thin film had a crystal structure. The SEM data revealed that the surface morphology of the CIGS thin film was very dense. The XRD pattern was obtained using a diffractometer (XRD-600, Shimadzu, Japan), and the SEM images were obtained using a SEM microscope (5-4200, Hitachi, Japan).

Comparative Example 1-1

Production of CIGS Thin Film by Single Coating of Highly Viscous Paste 1 g (5 mmol) of $Cu(NO_3)_2.xH_2O$, 0.4 g (1.6 mmol) of $Ga(NO_3)_3.xH_2O$, and 1.12 g (3.7 mmol) of $In(NO_3)_3.xH_2O$ were dissolved in 80 mL of ethanol. The solution was mixed with 20 mL of a solution of 13.7 g of terpineol and 0.75 g of ethyl cellulose in ethanol with stirring. Thereafter, the ethanol was removed by evaporation at 40° C. for 30 min to obtain a CIG precursor paste having a proper viscosity. The paste was spin coated on a Mo glass substrate and thermally treated in an air atmosphere at 350° C. for 1 hr and in a sulfur atmosphere at 500° C. for 30 min to obtain a CIGS thin film.

Figure 4:
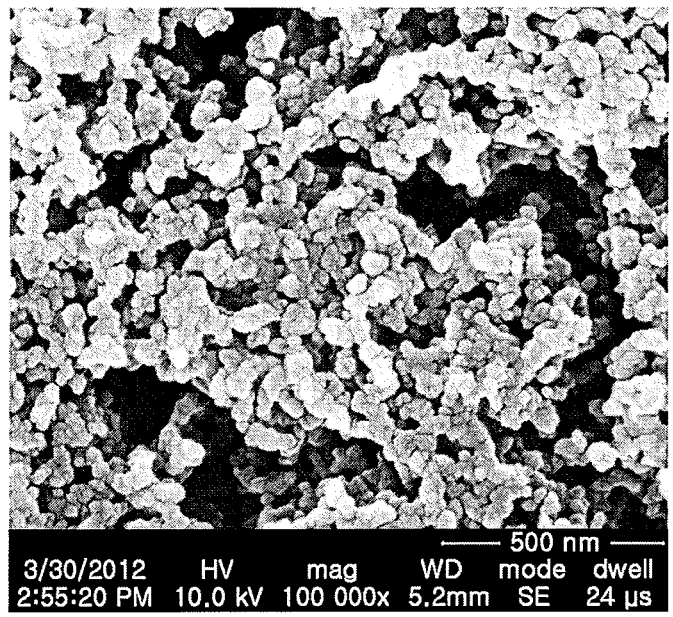
FIG. 4 is a front SEM image of a CIGS thin film produced using a single kind of paste including ethyl cellulose as a binder.

A SEM image of the CIGS thin film is shown in FIG. 4. The morphology of the CIGS thin film was analyzed by the SEM image. The SEM data revealed the presence of many pores on the surface of the CIGS thin film, unlike the SEM image of the CIGS thin film of Example 1. The SEM image was obtained using a SEM microscope (S-4200, Hitachi, Japan).

Comparative Example 1-2

Production of CIGS Thin Film by Single Coating of Low-Viscosity Paste 1 g (5 mmol) of $Cu(NO_3)_2.xH_2O$, 0.4 g (1.6 mmol) of $Ga(NO_3)_3.xH_2O$, and 1.12 g (3.7 mmol) of $In(NO_3)_3.xH_2O$ were dissolved in 7 mL of methanol. The solution was mixed with 1 g of polyvinyl acetate and 7 mL of methanol with stirring to obtain a CIG precursor paste. The paste was spin-coated on a Mo glass substrate and sequentially dried at 150° C. for 3 min and at 300° C. for 7 min. Thereafter, the paste coating and drying were repeated six times to obtain a thin film. The thin film was thermally treated in a furnace in an air atmosphere at 300° C. for 30 min, followed by thermal treatment in a sulfur atmosphere at 500° C. for 30 min to obtain a CIGS thin film.

Figure 5:
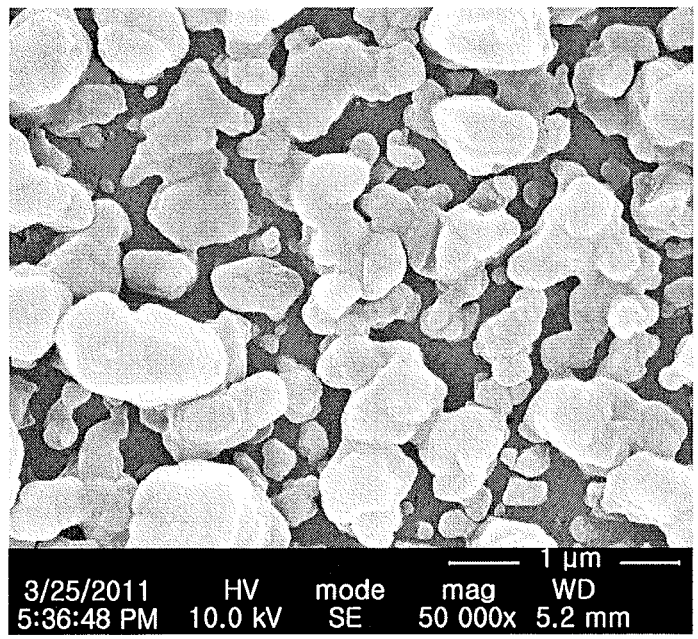
FIG. 5 is a front SEM image of a CIGS thin film produced using another kind of paste including polyvinyl acetate as a binder.

A SEM image of the CIGS thin film is shown in FIG. 5. The morphology of the CIGS thin film was analyzed by the SEM image. The SEM data revealed that the CIGS thin film was very dense. The SEM image was obtained using a SEM microscope (S-4200, Hitachi, Japan).

Example 2

Production of CIGS Thin Film by Coating of Two Kinds of Pastes Having Different Compositions of Elements 1 g (5 mmol) of $Cu(NO_3)_2.xH_2O$ and 1.36 g (5 mmol) of $Ga(NO_3)_3.xH_2O$ were dissolved in 7 mL of methanol. The solution was mixed with 1 g of polyvinyl acetate and 7 mL of methanol to obtain a paste of the Cu and Ga precursors. The paste was spin coated on a glass substrate and thermally treated on a hot plate at 150° C. for 3 min and at 300° C. for 7 min. As a result of the thermal treatment, the paste was solidified.

1 g (5 mmol) of $Cu(NO_3)_2.H_2O$ and 1.6 g (5 mmol) of $In(NO_3)_3.xH_2O$ were dissolved in 7 mL of methanol. The solution was mixed with 1 g of polyvinyl acetate and 7 mL of methanol with stirring to obtain a paste of the Cu and In precursors. The two pastes had different compositions of the elements. The paste was spin coated on the thin film of the previous CIG precursor paste, followed by sequential thermal treatment on a hot plate at 150° C. for 3 min and at 300° C. for 7 min. As a result of the thermal treatment, the paste was solidified.

After drying, the substrate, on which the thin films were formed, was thermally treated in an air atmosphere at 300° C. for 30 min and in a sulfur atmosphere at 500° C. for 30 min to obtain a thin film in which the thin films having different compositions were distinctly separated from each other.

Figure 6:
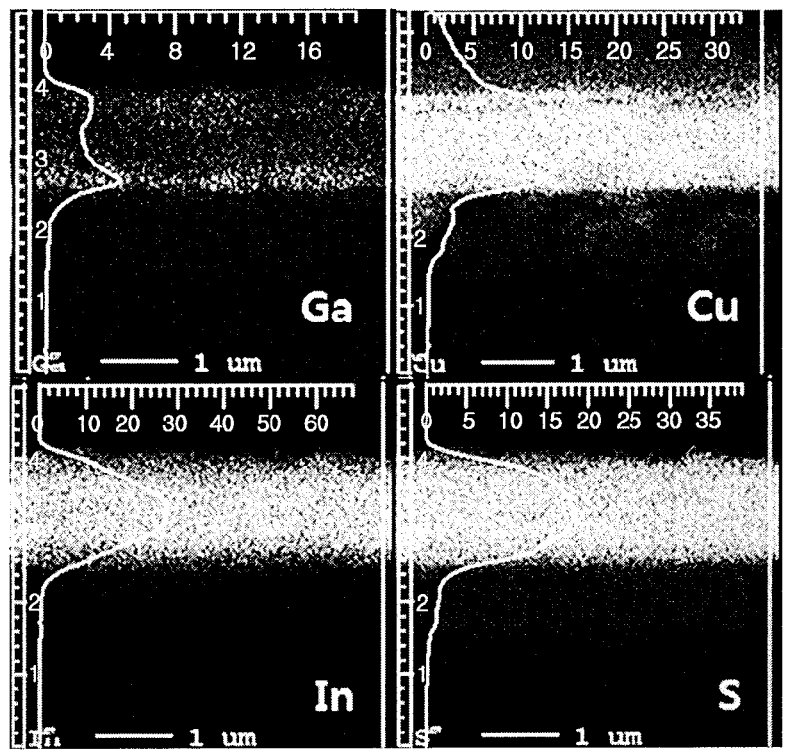
FIG. 6 shows EPMA results for the composition distribution of a CIGS thin film produced by coating of two kinds of pastes having different compositions of elements.

The distributions of the Ga element in the thin film were confirmed by EPMA analysis, and the results are shown in FIG. 6. The EPMA analysis was conducted using a JXA-8500F EPMA.

Comparative Example 2

Production of CIGS Thin Film by Single Paste Coating 1 g (5 mmol) of $Cu(NO_3)_2.xH_2O$, 0.4 g (1.6 mmol) of $Ga(NO_3)_3.xH_2O$, and 1.12 g (3.7 mmol) of $In(NO_3)_3.xH_2O$ were dissolved in 7 mL of methanol. The solution was mixed with 1 g of polyvinyl acetate and 7 mL of methanol to obtain a CIG precursor paste. The paste was spin coated on a Mo glass substrate and thermally treated at 150° C. for 3 min and at 300° C. for 7 min. As a result of the thermal treatment, the paste was dried. Thereafter, the paste coating and drying were repeated six times to obtain a thin film. The thin film was thermally treated in a furnace in an air atmosphere at 300° C. for 30 min, followed by thermal treatment in a sulfur atmosphere at 500° C. for 30 min to obtain a CIGS thin film.

Figure 7:
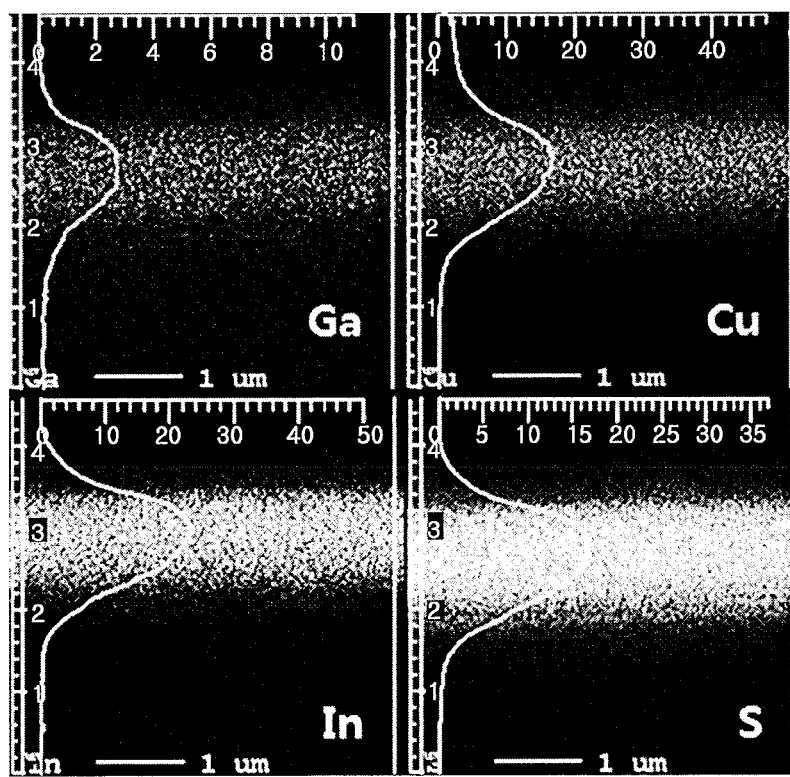
FIG. 7 shows EPMA results for the composition distribution of a CIGS thin film produced by coating of a single kind of paste.

The distributions of the Ga element in the thin film were confirmed by EPMA analysis, and the results are shown in FIG. 7. The EPMA analysis was conducted using a JXA-8500F EPMA.

Example 3

Fabrication of Solar Cell Using CIGS Thin Film Produced by Multi-Stage Paste Coating The CIGS thin film produced in Example 1 was used as a light-absorbing layer to fabricate a CIGS thin film solar cell having a general structure known in the art. The other layers of the CIGS thin film solar cell were produced by methods well known in the art. That is, the CdS buffer layer was produced by chemical bath deposition and the ZnO or ZnO:Al window layer was produced by sputtering.

Figure 8:
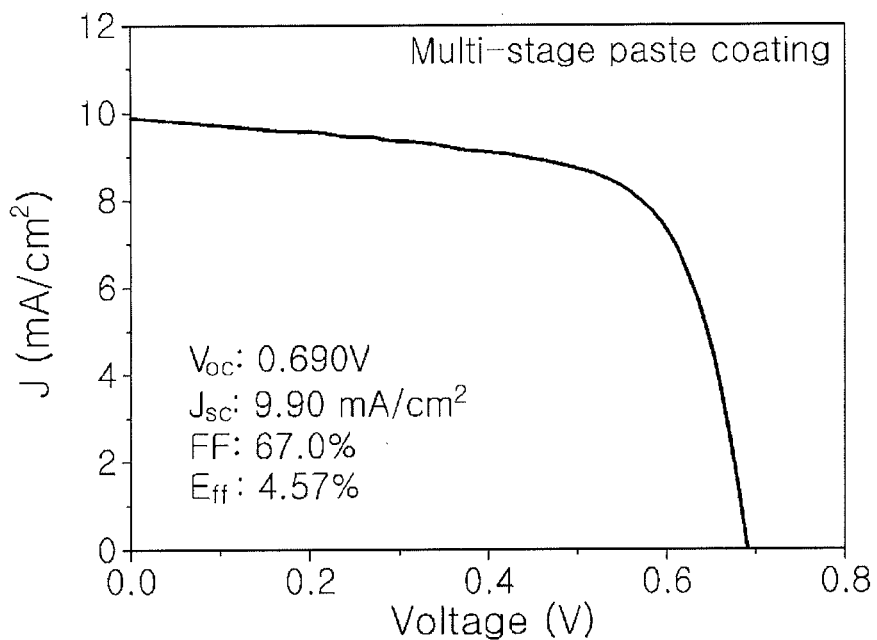
FIG. 8 shows the J-V characteristics of solar cells using CIGS thin films produced by multi-stage paste coating and single paste coating.
Figure 8:
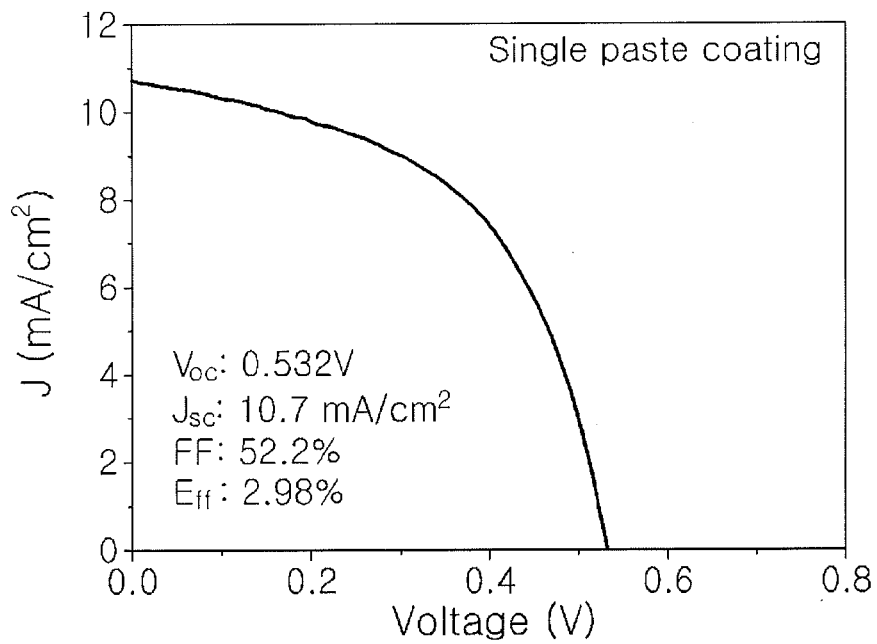

Finally, Al was deposited to form an electrode, completing fabrication of the device. The J-V characteristics of the device were measured. The device was found to have a photoelectric conversion efficiency of 4.57%. The results are shown in FIG. 8.

Comparative Example 3

Fabrication of Solar Cell Using CIGS Thin Film Produced by Single Paste Coating

The CIGS thin film produced in Comparative Example 1 was used as a light-absorbing layer to fabricate a CIGS thin film solar cell having a general structure known in the art. The CdS buffer layer and the ZnO or ZnO:Al window layer of the CIGS thin film solar cell were produced by chemical bath deposition and sputtering, respectively. Finally, Al was deposited to form an electrode, completing fabrication of the device. The J-V characteristics of the device were measured. The device was found to have a photoelectric conversion efficiency of 2.98%. The results are shown in FIG. 8.

What is claimed is:

1. A method for producing a chalcopyrite compound thin film, the method comprising
    (a) mixing a first metal precursor, a first organic binder, and a first water-soluble solvent to obtain a first paste,
    (b) mixing a second metal precursor, a second organic binder, and a second water-soluble solvent to obtain a second paste,
    (c) coating the first paste on a conductive substrate to form a first paste layer,
    (d) coating the second paste on the first paste layer to form a second paste layer,
    (e) thermally treating the coated conductive substrate in air or an oxygen atmosphere to obtain a mixed oxide thin film, and
    (f) thermally treating the mixed oxide thin film in a sulfur gas, a selenium gas or a sulfur/selenium mixed gas atmosphere to form a sulfide or selenide thin film,
    wherein the first metal precursor and the second metal precursor are identical to or different from each other and are each independently a precursor of one or more Group IB metals, a precursor of one or more Group IIIA metals, or a mixture thereof,
    the precursor of one or more Group IB metals and the precursor of one or more Group IIIA metals are each independently included in either the first metal precursor or the second metal precursor or both of them,
    the first water-soluble solvent and the second water-soluble solvent are identical to or different from each other and are each independently selected from water, alcohol, acetone, and mixtures thereof, the first organic binder and the second organic binder are identical to or different from each other and are each independently selected from ethyl cellulose, polyvinyl acetate, palmitic acid, polyethylene glycol, polypropylene glycol, polypropylene carbonate, propylenediol, and mixtures thereof, and the conductive substrate is made of indium tin oxide, fluorine-doped indium tin oxide, glass, Mo-coated glass, a metal foil, a metal plate, a conductive polymer material, or a mixture thereof, or is a non-conductive substrate coated with indium tin oxide, fluorine-doped indium tin oxide, glass, Mo-coated glass, a metal foil, a metal plate, a conductive polymer material or a mixture thereof.

2. A method for producing a chalcopyrite compound thin film, the method comprising
   (a) mixing first metal precursors, a first organic binder, and a first water-soluble solvent to obtain a first paste,
   (b) mixing second metal precursors, a second organic binder, and a second water-soluble solvent to obtain a second paste,
   (c) coating the first paste on a conductive substrate to form a first paste layer,
   (d) coating the second paste on the first paste layer to form a second paste layer,
   (e) thermally treating the coated conductive substrate in air or an oxygen atmosphere to obtain a CIG mixed oxide thin film, and
   (f) thermally treating the CIG mixed oxide thin film in a sulfur gas, a selenium gas or a sulfur/selenium mixed gas atmosphere to form a CIGS thin film, wherein the first metal precursors and the second metal precursors are identical to or different from each other and are each independently two or more kinds of precursors selected from Cu, In and Ga precursors, the Cu, In and Ga precursors are each independently included in either the first metal precursors or the second metal precursors or both of them, the first water-soluble solvent and the second water-soluble solvent are identical to or different from each other and are each independently selected from water, alcohol, acetone, and mixtures thereof, the first organic binder and the second organic binder are identical to or different from each other and are each independently selected from ethyl cellulose, polyvinyl acetate, palmitic acid, polyethylene glycol, polypropylene glycol, polypropylene carbonate, propylenediol, and mixtures thereof, and the conductive substrate is made of indium tin oxide, fluorine-doped indium tin oxide, glass, Mo-coated glass, a metal foil, a metal plate, a conductive polymer material, or a mixture thereof, or is a non-conductive substrate coated with indium tin oxide, fluorine-doped indium tin oxide, glass, Mo-coated glass, a metal foil, a metal plate, a conductive polymer material or a mixture thereof.

3. The method according to claim 1 or 2, wherein the viscosity of the first paste is different by 400 to 1,500 cP from that of the second paste.

4. The method according to claim 3, wherein the first paste and the second paste have viscosities of 700 to 1,500 cP and 50 to 300 cp, respectively.

5. The method according to claim 1 or 2, wherein the first organic binder is (i) ethyl cellulose or (ii) a mixture comprising 90 to 99.9 parts by weight of ethyl cellulose and 0.1 to 10 parts by weight of polyvinyl acetate, palmitic acid, polyethylene glycol, polypropylene glycol, polypropylene carbonate, propylenediol or a mixture thereof; and the second organic binder is (i) polyvinyl acetate or (ii) a mixture comprising 90 to 99.9 parts by weight of polyvinyl acetate and 0.1 to 10 parts by weight of ethyl cellulose, palmitic acid, polyethylene glycol, polypropylene glycol, polypropylene carbonate, propylenediol or a mixture thereof.

6. The method according to claim 2, wherein the ratios of the concentration of the Cu element to the sum of the concentrations of the In element and Ga element in the first paste layer and the second paste layer are 1:0.9-1.1, and the ratio of the concentration of the Ga element to that of the Cu element in the first paste layer is different by 0.1 to 0.9 from the ratio of the concentration of the Ga element to that of the Cu element in the second paste layer.

7. The method according to claim 2, further comprising forming a third paste layer on the second paste layer wherein the ratios of the concentration of the Cu element to the sum of the concentrations of the In and Ga elements in the first, second and third paste layers are 1:0.9-1.3:0.9-1.3, and the concentration distributions of the Ga element in the paste layers are adjusted such that the ratios of the concentration of the Ga element to that of the Cu element in the first and third paste layers are greater by 0.1 to 0.9 than the ratio of the concentration of the Ga element to that of the Cu element in the second paste layer.

8. The method according to claim 1 or 2, wherein steps (e) and (f) are carried out at temperatures of 250 to 550° C. and 400 to 600° C., respectively, the sulfur gas atmosphere is a $H_2S$ gas or S vapor atmosphere, and the selenium gas atmosphere is a $H_2Se$ gas or Se vapor atmosphere.

9. The method according to claim 1 or 2, wherein step (c) further comprises (c-1) drying the first paste coated on the conductive substrate in an air atmosphere at 100 to 300° C.

10. The method according to claim 1 or 2, wherein the step (d) further comprises (d-1) drying the second paste coated on the first paste layer in an air atmosphere at 100 to 300° C.

11. The method according to claim 2, wherein the Cu precursor is (i) a hydroxide, nitrate, sulfate, acetate, chloride, acetylacetonate, formate or oxide of Cu, (ii) a hydroxide, nitrate, sulfate, acetate, chloride, acetylacetonate, formate or oxide of a Cu/In or Cu/Ga alloy, or (iii) a mixture thereof;
   the In precursor is (i) a hydroxide, nitrate, sulfate, acetate, chloride, acetylacetonate, formate or oxide of In, (ii) a hydroxide, nitrate, sulfate, acetate, chloride, acetylacetonate, formate or oxide of an In/Cu or In/Ga alloy, or (iii) a mixture thereof; and
   the Ga precursor is (i) a hydroxide, nitrate, sulfate, acetate, chloride, acetylacetonate, formate or oxide of Ga, (ii) a hydroxide, nitrate, sulfate, acetate, chloride, acetylacetonate, formate or oxide of a Ga/Cu or Ga/In alloy, or (iii) a mixture thereof.

12. The method according to claim 1 or 2, wherein (i) the first paste further comprises a dispersant selected from α-terpineol, ethylene glycol, thioacetamide, ethylenediamine, and mixtures thereof, (ii) the second paste further comprises a dispersant selected from α-terpineol, ethylene glycol, thioacetamide, ethylenediamine, and mixtures thereof, or (iii) each of the first and second pastes further comprises a dispersant selected from α-terpineol, ethylene glycol, thioacetamide, ethylenediamine, and mixtures thereof.

13. The method according to claim 1 or 2, wherein the first and second pastes each independently further comprise a dopant selected from Na, K, Ni, P, As, Sb, Bi, and mixtures thereof, and the dopant is present in an amount of 1 to 100 parts by weight, based on 100 parts by weight of the first metal precursor(s) and the second metal precursor(s).

14. A method for producing a chalcopyrite compound thin film, the method comprising:
thermally treating a coated conductive substrate in air or an oxygen atmosphere to obtain a mixed oxide thin film from a first paste layer coated on the conductive substrate and a second paste layer coated on the first paste, wherein the first and second paste layers each independently comprise at least one selected from the group consisting of a Group IB metal and a Group IIIA metal; and
thermally treating the mixed oxide thin film in a sulfur gas, a selenium gas or a sulfur/selenium mixed gas atmosphere to form a sulfide or selenide thin film.

15. The method of claim 14, further comprising:
mixing a first metal precursor, a first organic binder, and a first water-soluble solvent to obtain a first paste;
mixing a second metal precursor, a second organic binder, and a second water-soluble solvent to obtain a second paste;
coating the first paste on the conductive substrate to form the first paste layer; and
coating the second paste on the first paste layer to form the second paste layer, wherein the first metal precursor and the second metal precursor are identical to or different from each other and are each independently a precursor of one or more Group IB metals, a precursor of one or more Group IIIA metals, or a mixture thereof,
the precursor of one or more Group IB metals and the precursor of one or more Group IIIA metals are each independently included in either the first metal precursor or the second metal precursor or both of them,
the first water-soluble solvent and the second water-soluble solvent are identical to or different from each other and are each independently selected from water, alcohol, acetone, and mixtures thereof,
the first organic binder and the second organic binder are identical to or different from each other and are each independently selected from ethyl cellulose, polyvinyl acetate, palmitic acid, polyethylene glycol, polypropylene glycol, polypropylene carbonate, propylenediol, and mixtures thereof, and
the conductive substrate is made of indium tin oxide, fluorine-doped indium tin oxide, glass, Mo-coated glass, a metal foil, a metal plate, a conductive polymer material, or a mixture thereof, or is a non-conductive substrate coated with indium tin oxide, fluorine-doped indium tin oxide, glass, Mo-coated glass, a metal foil, a metal plate, a conductive polymer material or a mixture thereof.

16. A method for producing a chalcopyrite compound thin film, the method comprising:
thermally treating a conductive substrate coated with a first paste layer and a second paste layer coated on the first paste layer in air or an oxygen atmosphere to obtain a CIG mixed oxide thin film, wherein the first and second paste layers each independently comprise at least one selected from the group consisting of Cu, In, and Ga; and
thermally treating the CIG mixed oxide thin film in a sulfur gas, a selenium gas or a sulfur/selenium mixed gas atmosphere to form a CIGS thin film.

17. The method of claim 16, further comprising:
mixing first metal precursors, a first organic binder, and a first water-soluble solvent to obtain a first paste;
mixing second metal precursors, a second organic binder, and a second water-soluble solvent to obtain a second paste;
coating the first paste on the conductive substrate to form the first paste layer;
coating the second paste on the first paste layer to form the second paste layer,
wherein the first metal precursors and the second metal precursors are identical to or different from each other and are each independently two or more kinds of precursors selected from Cu, In and Ga precursors,
the Cu, In and Ga precursors are each independently included in either the first metal precursors or the second metal precursors or both of them,
the first water-soluble solvent and the second water-soluble solvent are identical to or different from each other and are each independently selected from water, alcohol, acetone, and mixtures thereof,
the first organic binder and the second organic binder are identical to or different from each other and are each independently selected from ethyl cellulose, polyvinyl acetate, palmitic acid, polyethylene glycol, polypropylene glycol, polypropylene carbonate, propylenediol, and mixtures thereof, and
the conductive substrate is made of indium tin oxide, fluorine-doped indium tin oxide, glass, Mo-coated glass, a metal foil, a metal plate, a conductive polymer material, or a mixture thereof, or is a non-conductive substrate coated with indium tin oxide, fluorine-doped indium tin oxide, glass, Mo-coated glass, a metal foil, a metal plate, a conductive polymer material or a mixture thereof.

18. A method for producing a chalcopyrite compound thin film, the method comprising
heating a second paste layer formed on a first paste layer to obtain a mixed oxide thin film, wherein the first and second paste layers each independently comprise a Group IB metal and/or a Group IIIA metal; and
heating the mixed oxide thin film in an atmosphere comprising sulfur, or selenium, or a mixture thereof to form a sulfide and/or selenide thin film on the mixed oxide thin film.

19. The method of claim 18, further comprising:
mixing a first metal precursor, a first organic binder, and a first water-soluble solvent to obtain a first paste;
mixing a second metal precursor, a second organic binder, and a second water-soluble solvent to obtain a second paste;
coating the first paste on a conductive substrate to form the first paste layer; and
coating the second paste on the first paste layer to form the second paste layer, wherein the first metal precursor and the second metal precursor are identical to or different from each other and are each independently a precursor of one or more Group IB metals, a precursor of one or more Group IIIA metals, or a mixture thereof,
the precursor of one or more Group IB metals and the precursor of one or more Group IIIA metals are each independently included in either the first metal precursor or the second metal precursor or both of them,
the first water-soluble solvent and the second water-soluble solvent are identical to or different from each other and are each independently selected from water, alcohol, acetone, and mixtures thereof,
the first organic binder and the second organic binder are identical to or different from each other and are each independently selected from ethyl cellulose, polyvinyl acetate, palmitic acid, polyethylene glycol, polypropylene glycol, polypropylene carbonate, propylenediol, and mixtures thereof, and
the conductive substrate is made of indium tin oxide, fluorine-doped indium tin oxide, glass, Mo-coated glass, a metal foil, a metal plate, a conductive polymer material, or a mixture thereof, or is a non-conductive substrate coated with indium tin oxide, fluorine-doped indium tin oxide, glass, Mo-coated glass, a metal foil, a metal plate, a conductive polymer material or a mixture thereof.

20. A method for producing a chalcopyrite compound thin film, the method comprising:
heating a second paste layer formed on a first paste layer to obtain a CIG mixed oxide thin film, wherein the first and second paste layers each independently comprise at least one selected from the group consisting of Cu, In and Ga; and
heating the CIG mixed oxide thin film in an atmosphere comprising a sulfur gas, or a selenium gas or a sulfur/selenium mixed gas to form a CIGS thin film.

* * * * *